United States Patent [19]

Stanton

[11] Patent Number: 5,650,908
[45] Date of Patent: Jul. 22, 1997

[54] SURGE ARRESTOR FOR RF DEVICES

[75] Inventor: Robert Stanton, Hatboro, Pa.

[73] Assignee: General Instrument Corporation, Hatboro, Pa.

[21] Appl. No.: 654,799

[22] Filed: May 29, 1996

Related U.S. Application Data

[63] Continuation of Ser. No. 302,271, Sep. 8, 1994, abandoned.

[51] Int. Cl.$^6$ ..................................................... H02H 1/00
[52] U.S. Cl. ............................................. 361/113; 361/111
[58] Field of Search ............................. 361/58, 111, 113, 361/119

[56] References Cited

U.S. PATENT DOCUMENTS

| | | | |
|---|---|---|---|
| 3,801,870 | 4/1974 | Grove, Jr. et al. | 361/16 |
| 3,912,980 | 10/1975 | Crump et al. | 361/79 |
| 3,914,685 | 10/1975 | Van Gilder | 323/20 |
| 3,932,804 | 1/1976 | Allen | 361/58 |
| 4,085,299 | 4/1978 | Hobrough | 179/184 |
| 4,161,008 | 7/1979 | Zimmermann et al | 361/119 |
| 4,591,779 | 5/1986 | Carpenter, Jr. et al. | 323/301 |
| 4,807,083 | 2/1989 | Austin | 361/111 |
| 4,816,956 | 3/1989 | Hertz et al. | 361/42 |
| 5,053,910 | 10/1991 | Goldstein | 361/111 |
| 5,241,447 | 8/1993 | Barber et al. | 361/58 |
| 5,293,298 | 3/1994 | Foglia | 361/113 |

FOREIGN PATENT DOCUMENTS

| | | |
|---|---|---|
| 020292983 | 4/1990 | Japan . |
| 433381 | 8/1935 | United Kingdom . |
| 1204958 | 9/1970 | United Kingdom . |

OTHER PUBLICATIONS

The Art of Electronics, Second Edition by Paul Horowitz and Winfield Hill Chapter 7 —Precision Circuits and Low–Noise Techniques, pp. 458–462.

*Primary Examiner*—Howard L. Williams
*Assistant Examiner*—Sally C. Medley
*Attorney, Agent, or Firm*—Volpe and Koenig, P.C.

[57] ABSTRACT

An improved surge arrestor for RF devices includes a bifilar conductor pair wound around a ferrite core wherein one end of each conductor is grounded. The energy of RF signals input to the surge arrestor from an RF transmission line is transferred from the primary windings to the secondary windings through the magnetic coupling. When an electrical transient or fault causes a surge on the input or primary side of the surge arrestor, the core becomes saturated, thereby limiting the amount of energy transferred to the secondary windings and the RF device. This effectively isolates the secondary side of the surge arrestor from the damaging surge in voltage and prevents the secondary side from conducting the surge to electronic components within the RF device.

13 Claims, 4 Drawing Sheets

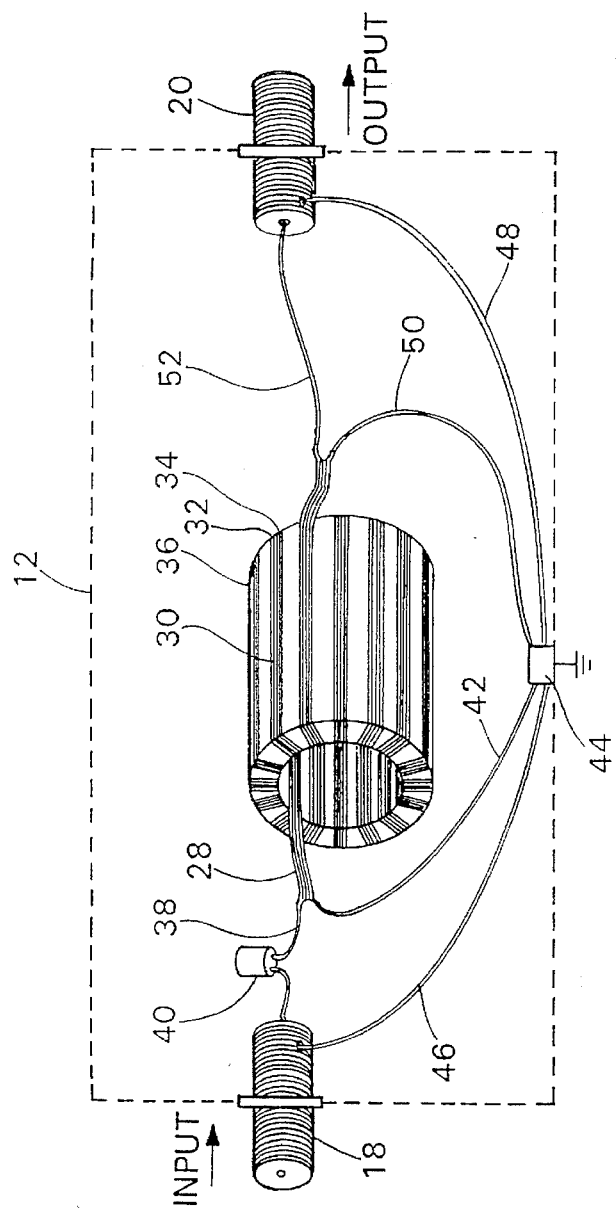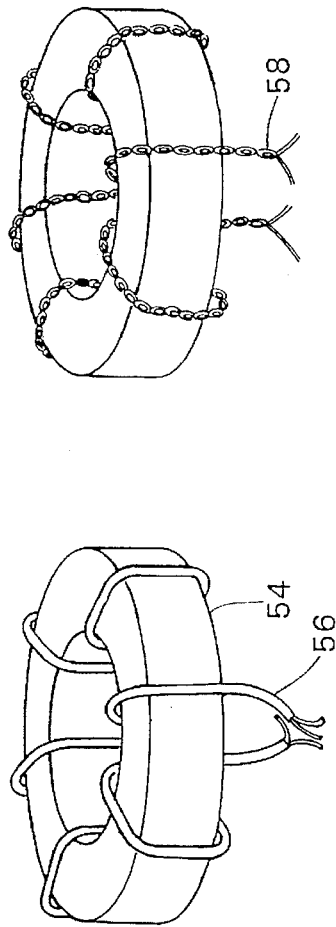

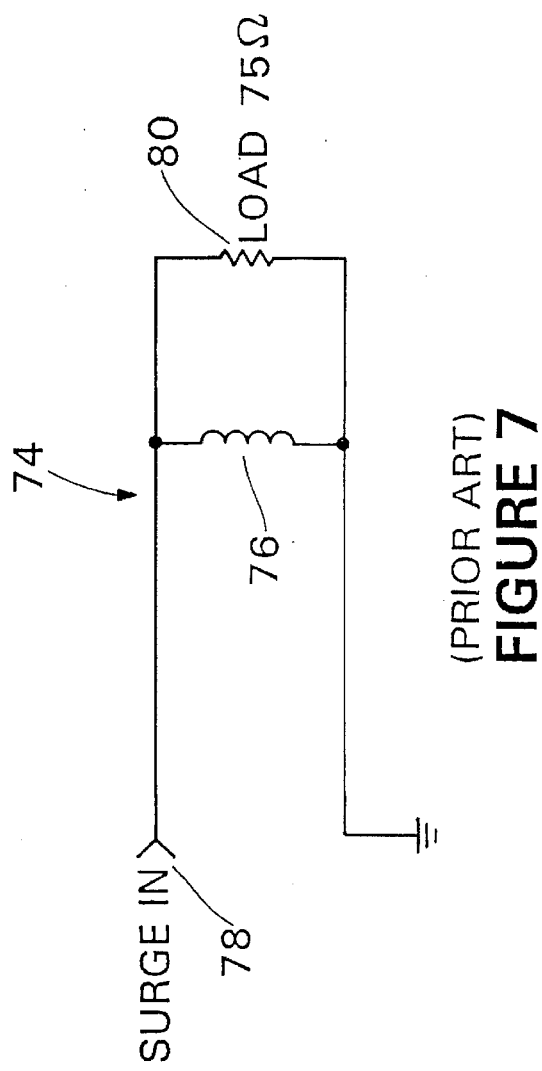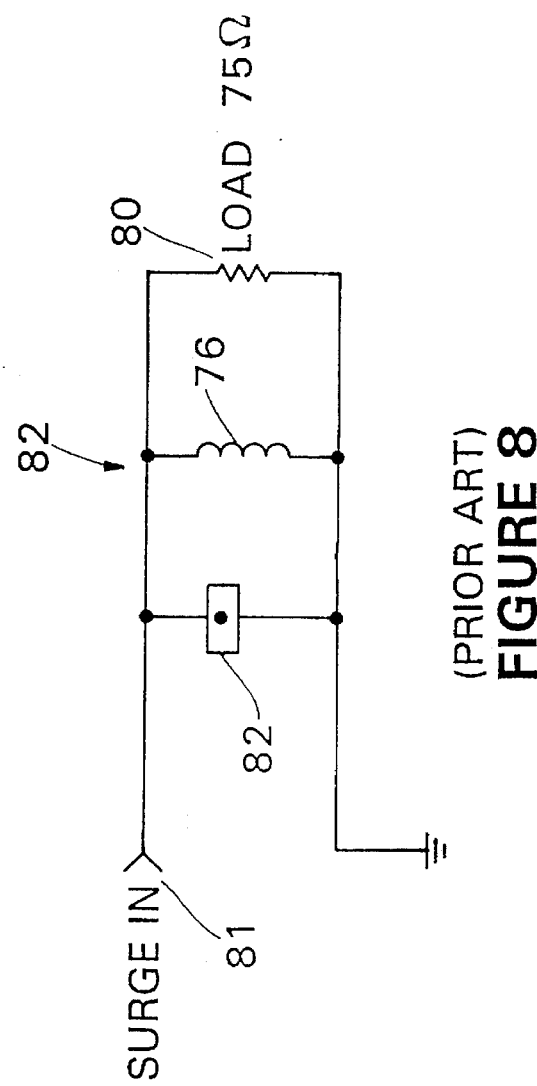
FIGURE 7 (PRIOR ART)
FIGURE 8 (PRIOR ART)

SURGE ARRESTOR FOR RF DEVICES

This application is a continuation of application Ser. No. 08/302,271, filed Sep. 8, 1994, now abandoned.

FIELD OF THE INVENTION

This invention relates generally to devices which provide electrical surge protection. More particularly, the invention relates to a surge arrestor for an RF electrical device which provides improved performance for wide band RF applications.

BACKGROUND OF THE INVENTION

The proliferation of radio frequency (RF) systems and components have increased greatly in recent years. Cable television systems have introduced RF components into millions of homes, and the number continues to grow every year. RF components have also become much more complex as cable television companies offer an increasing array of services, and consumers continue to demand more features from cable television suppliers such as movies on demand, phone services and other interactive services.

The complexity of the RF devices, such as cable television channel selector units, video cassette recorders and cable-ready televisions, greatly increases the number of electronic components contained within each device. The electronics within RF devices include amplifiers, microprocessors and other semiconductor components. These components are easily damaged when exposed to electrical voltage or current surges from outside sources. RF transmission lines are subject to electrical transients and faults, which may be introduced to the RF devices, causing damage to sensitive electronic components.

Accordingly, protection is needed for the sensitive electronic components within an RF device from damage caused by electrical transients on RF transmission lines and sources.

There are several well known techniques for preventing undesirable electrical surges in RF transmission lines from causing damage to electronic components. One technique is to filter the input by inserting an inductor between the input transmission line and the RF device. The filter suppresses the transient by diverting energy from the RF device, and preventing most of the energy from the transient from reaching the RF device. The magnitude of the transient, although reduced, is still significant enough to cause considerable damage to sensitive electronic components within RF devices.

The use of an inductor as a filter is conventionally enhanced by coupling the inductor with a gas discharge tube. This has been the industry standard for over 30 years. The gas discharge tube greatly increases the ability of the inductor to suppress large electrical transients. However, gas discharge tubes are relatively expensive for this type of application and their service life is limited to only a small number of electrical transients.

Another common surge suppression technique utilized for electronic applications is to buffer the device from the input line with a transformer. Although this provides adequate surge protection, the performance of conventional transformers degrade as the frequency increases. For wide band RF devices, conventional transformer surge suppression is not acceptable since the ferrite core will not carry the RF signal energy from the primary side to the secondary side.

Applicant has recognized that there is a need to develop a more economical electrical surge protection device for wide band RF applications.

SUMMARY OF THE INVENTION

An improved surge arrestor for RF devices is disclosed. The arrestor includes a bifilar conductor pair wound around a ferrite core wherein one end of each conductor is grounded.

The energy of RF signals input to the surge arrestor from an RF transmission line is transferred from the primary windings to the secondary windings through the magnetic and capacitive coupling of the bifilar conductor pair. The signals are then output to the RF device. When an electrical transient or fault causes a surge on the input side of the surge arrestor and the primary windings, the core becomes saturated, thereby limiting the amount of energy transferred to the secondary windings and the RF device. This effectively isolates the secondary side of the surge arrestor from the damaging surge in voltage and prevents the secondary side from conducting the surge to electronic components within the RF device.

Accordingly, it is an object of the present invention to provide an economical means for electrical surge protection of an RF device which supports operation of the RF device over a wide band of RF frequencies.

Further objects and advantages of the invention will become apparent to those of ordinary skill in the art from the following specification and claims.

BRIEF DESCRIPTION OF THE DRAWINGS

FIG. 2 is a perspective view of the surge arrestor of the present invention.

FIG. 3 is an alternate embodiment of the surge arrestor of FIG. 2.

FIG. 4 is a second alternate embodiment of the surge arrestor of FIG. 2.

FIG. 7 is a prior art surge suppressor utilizing an inductor.

FIG. 8 is a prior art surge suppressor utilizing an inductor coupled with a gas discharge tube.

DESCRIPTION OF THE PREFERRED EMBODIMENT

Figure 1:
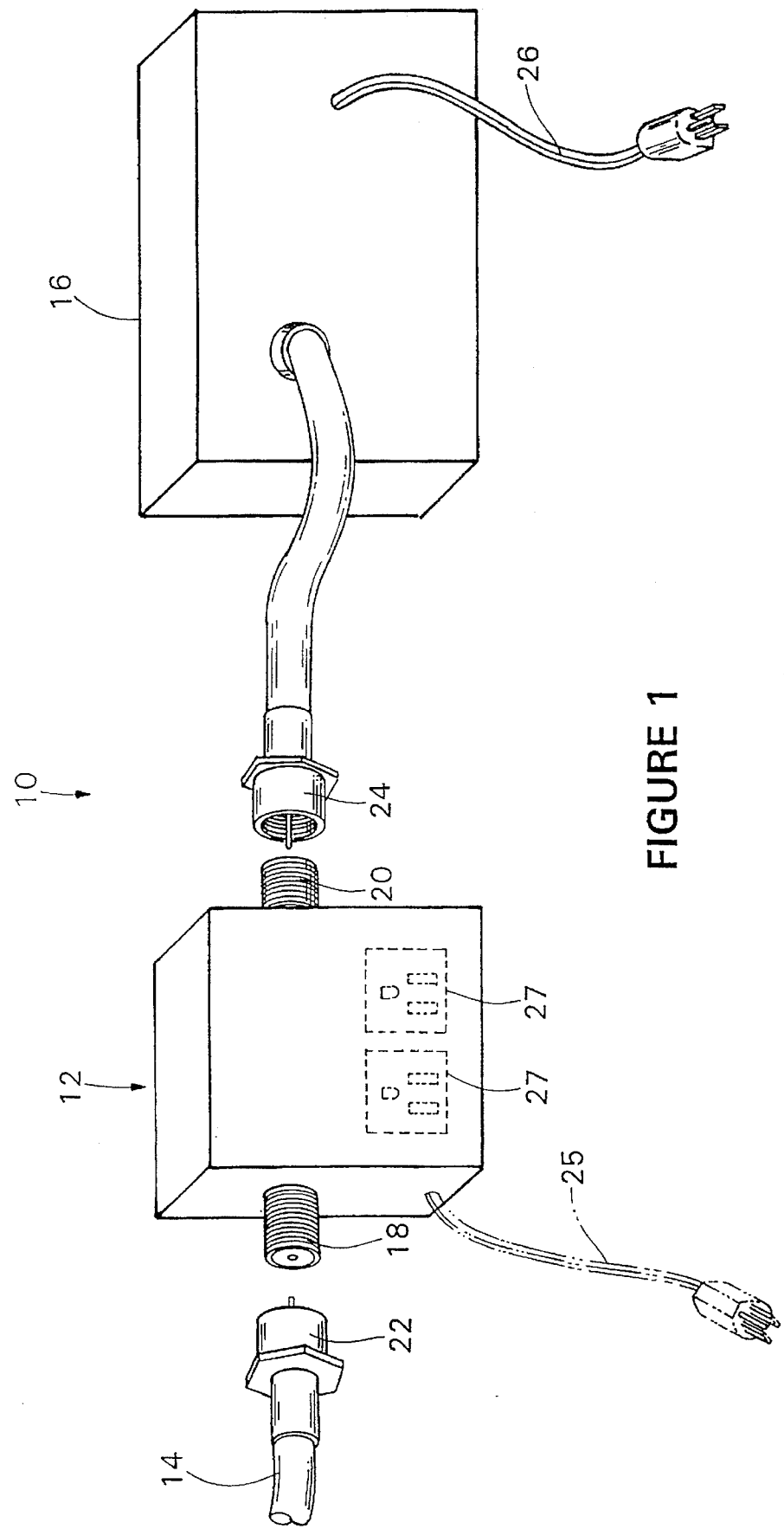
FIG. 1 is a perspective view of an RF device coupled to a surge arrestor made in accordance with the teachings of the present invention.

Referring to FIG. 1, a surge arrestor 12 for RF devices of the present invention is shown. The surge arrestor 12 is located at the junction between an RF signal generator, or transmission line 14, and an RF device 16 or load. The RF transmission line 14 is the component of the RF system 10 that is typically subject to voltage surges caused by lightning, electrical faults or other electrical transients. The surge arrestor 12 includes an input coaxial interface 18 and an output coaxial interface 20. Preferably, each coaxial interface 18, 20 comprises a standard female RF coaxial connector. The input coaxial interface 18 is coupled to the coaxial interface 20 of the RF transmission line 14, shown as a coaxial cable with a standard male RF coaxial connector. The output coaxial interface 20 is coupled to the coaxial interface 24 of the RF device 16, such as a cable television channel selector unit. The power input 26 to the RF device is connected to a standard 120 VAC power supply. Other RF devices include video cassette recorders and cable-ready television sets. Alternatively, as shown in FIG. 1, the surge arrestor 12 can be combined with a conventional power surge suppressor 13 having a power input lead 25 and at least one outlet 27. The power input 26 of the RF device 16 would then be connected to the power output 27 of the surge suppressor 13.

Referring to FIG. 2, the surge arrestor 12 comprises a bifilar conductor pair 28 forming a coil 30 of primary and secondary windings 32, 34 which is wound around a ferrite core 36. The physical dimensions of the core 36 and the windings 32, 34 are selected to achieve the desired surge suppression and frequency response.

The primary end of the first bifilar conductor 38 is connected to a capacitor 40, preferably 0.001 µF, which is coupled to the inner conductor of the input coaxial interface 18. The capacitor limits the total amount of energy entering the surge arrestor 12. The primary end of the second bifilar conductor 42 is connected to a ground terminal 44. The ground terminal 44 is connected by conductors 46, 48 to the outer conductor, or shield, of both coaxial interfaces 18, 20 respectively.

The secondary end of the first bifilar conductor 50 is connected to the ground terminal 44. The secondary end of the second bifilar conductor 52 is connected the inner conductor of the output coaxial interface 20.

The low frequency performance of the surge arrestor 12 is dependent upon the amount of inductive reactance in the core 36. Energy transfer from the primary windings 32 to the secondary windings 34 is dependent upon the frequency of the input RF signals. For frequencies above 100 MHz, the core 32 appears as though it is electrically isolated. Therefore, energy transfer is accomplished primarily through the magnetic coupling of the primary windings 32 to the secondary windings 34. Below 10 MHz, most of the energy transfer occurs through the magnetic coupling of the windings 32, 34 through the core 36. Therefore, the low frequency energy from the RF signals in the primary windings 32 must pass through the core 36 before entering the secondary windings 34. From 10–100 MHz energy is transferred through both types of magnetic coupling, however, the transfer of energy from the core 36 steadily decreases as the frequency of the RF signals approaches 100 MHz.

In operation, RF signals transmitted over the RF transmission line 14 are input to the surge arrestor 12 through the coaxial coupling 18 and enter the primary end of the first bifilar conductor 38. Through magnetic and capacitive coupling, energy from the RF signals on the primary windings 32 is transferred to the secondary windings 34. Since the turns ratio is 1:1, the RF signals are unchanged. The RF signals on the secondary windings 34 flow via the secondary end of the second bifilar conductor 52 to the inner conductor of the output coaxial interface 48.

When a transient on the RF transmission line 14 causes a voltage surge, the surge travels to the primary windings 32. Since the frequency of most transients that occur on RF systems is below 10 MHz, energy transfer of the transients is primarily dependent upon the magnetic coupling of the core 36 to the windings 32, 34. The voltage transient will quickly saturate the core 36, thereby limiting the amount of energy transferred through the core 36 to the secondary windings 34. Accordingly, the secondary windings 34 will be isolated from most of the voltage surge, thereby protecting the electronic components in the RF device 16 from damage.

In a preferred embodiment, the core 36 is substantially cylindrical in shape with a 5 mm diameter, a 3 mm core void diameter and a 5 mm length. A bifilar conductor pair 36 with an impedance of 75Ω is used, and there are approximately seven turns of the conductor pair 36 comprising the windings 32, 34. This results in core saturation with a transient voltage of greater than 100 volts, which is sufficient to provide isolation of the sensitive electronic components within the RF device 16 from the electrical transient. Preferably, the surge arrestor 12 permits an operational bandwidth of 4–250 MHz. This supports the desired operational bandwidth of 5–200 MHz.

Figure 5:
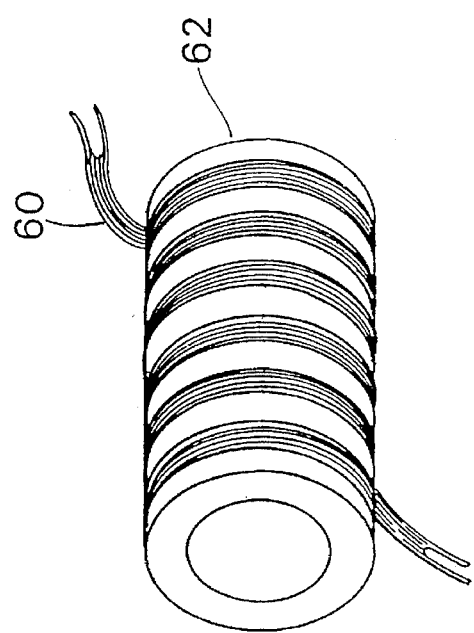
FIG. 5 is a third alternate embodiment of the surge arrestor of FIG. 2.

FIG. 3 is an alternate embodiment of the invention wherein the core 54 is shaped substantially similar to a toroid upon which the bifilar conductor pair 56 is wound. FIG. 4 is a second alternate embodiment of the invention wherein a twisted conductor pair 58 is utilized in place of the bifilar conductor pair. FIG. 5 is a third alternate embodiment wherein a bifilar conductor pair 60 is wound around the outer circumference of the core 62.

Figure 6:
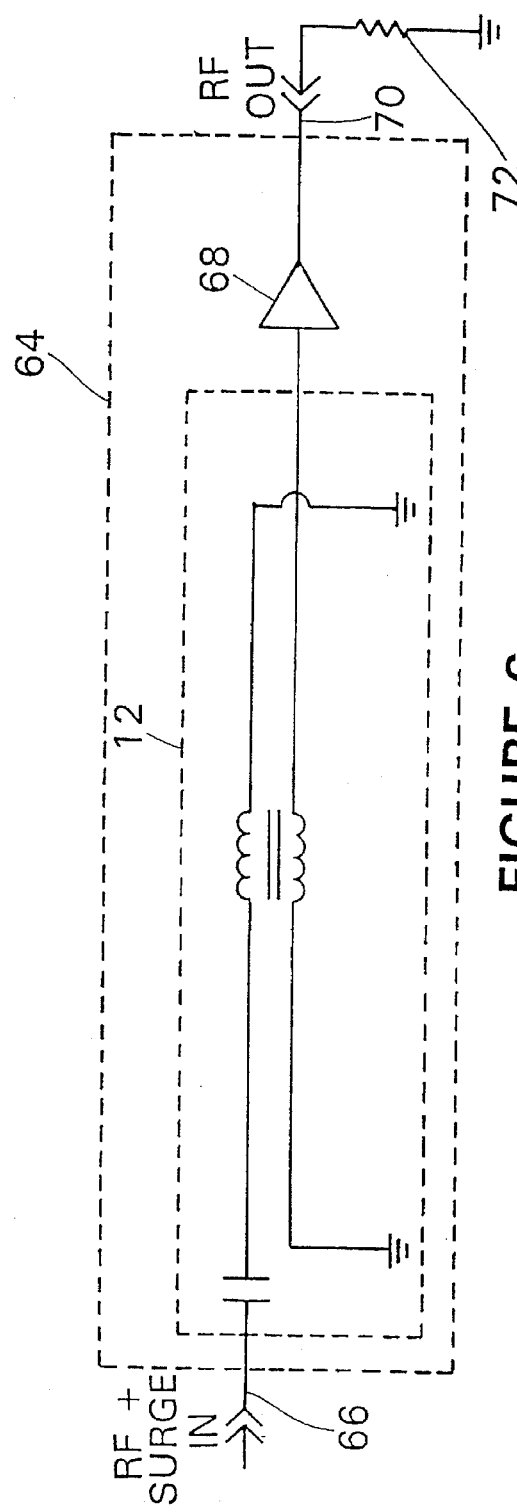
FIG. 6 is an electrical schematic diagram of an RF device including the arrestor of FIG. 2.

Although the surge arrestor 12 is shown as an auxiliary device for use with pre-existing RF devices, it can easily be built into the RF device when new RF devices are manufactured. Such a device is shown in FIG. 6 wherein the surge arrestor 12 is incorporated into an RF amplifier 64. In these cases, the input of the surge arrestor 12 would constitute the input of the RF device.

The amplifier electronics 68, are buffered from electrical transients occurring on the RF input 66 by the surge arrestor 12. This allows the amplifier 64 to provide an RF output 70 free from damaging electrical transients to an RF device 72.

Comparative tests were conducted between the inventive surge arrestor 12 and conventional surge suppressors schematically represented in FIGS. 7 and 8. The test results reflect a dramatic gain in surge protection of the inventive surge arrestor 12 over the prior art. As shown in FIG. 7, a conventional filter 74 comprises an inductor 76 inserted between the RF input line 78 and the load 80. The filter 74 was subjected in tests to a 3000 volt surge at the RF input 78. The surge was reduced to approximately 1112 volts across the load 80. A subsequent surge of 6000 volts vaporized the load 80. The magnitude of the voltage, although reduced, is significant enough to cause considerable damage to electronic components in RF devices.

As shown in FIG. 8, a conventional surge arrestor 82 which is in widespread industry use comprises a filter enhanced with a gas discharge tube 82. The suppressor 82 was subjected in tests to a 6000 volt surge at the RF input 81. The input voltage surge was reduced to 294 volts at the load 80.

By way of comparison, the preferred embodiment of the present invention was subjected in similar tests to a 6000 volt surge. The surge was reduced to a maximum voltage of 116 volts.

The preferred embodiment of the present invention costs approximately 1/10 of the cost of an equivalent conventional filter coupled with a gas discharge tube. This represents a significant improvement in performance over the prior art devices at a fraction of the cost.

The invention has been described in conjunction with a presently preferred embodiment and alternate embodiments. Other variations with respect to the embodiments described above will be apparent to those of ordinary skill in the art and are within the scope of the present invention.

I claim:

1. An electrical surge arrestor for an RF input of an electrical device comprising:

an input interface for connection to a RF signal input conductor;

an output interface for connection to the RF input of the electrical device;

a saturable ferrite core; and a bifilar conductor pair wound around said core for carrying an RF signal, having a primary end and a secondary end, wherein the primary end of the first conductor is connected to said input interface, the primary end of the second conductor is connected to ground, the secondary end of the first conductor is connected to ground and the secondary end of the second conductor is connected to said output interface.

2. The surge arrestor of claim 1 wherein said bifilar conductor pair has an RF impedance of 75Ω to pass RF signals over a bandwidth of at least 4–250 MHz from said input interface to said output interface.

3. The surge arrestor of claim 1 further comprising a housing.

4. The surge arrestor of claim 1 wherein said ferrite core is cylindrical.

5. The surge arrestor of claim 1 wherein said ferrite core is a toroid.

6. The surge arrestor of claim 1 wherein said pair is wound around the outer circumference of said core.

7. The surge arrestor of claim 1 wherein said ferrite core saturates with a transient voltage of greater than 100 volts.

8. The surge arrestor of claim 7 wherein a 6000 volt transient input to said input interface results in an increase of less than 200 volts at said output interface.

9. An RF device comprising:

an input interface for connection to a RF signal input conductor;

electronic means for processing RF signals; and an electrical surge arrestor coupled between said input interface and said RF processing means, the surge arrestor having:

a saturable ferrite core having a single core void; and a bifilar conductor pair repeatedly wound through said core void for carrying an RF signal, having a primary end and a secondary end, wherein the primary end of the first conductor is connected to said input interface, the primary end of the second conductor is connected to ground, the secondary end of the first conductor is connected to ground and the secondary end of the second conductor is connected to said RF processing means.

10. The RF device of claim 9 wherein said RF processing means is an RF amplifier.

11. The RF device of claim 9 wherein said RF processing means is a television channel selector unit.

12. The RF device of claim 9 wherein said pair has an RF impedance of 75Ω.

13. The RF device of claim 9 wherein said pair is wound around the outer circumference of said core.

* * * * *